United States Patent
Arora et al.

(10) Patent No.: US 11,903,160 B2
(45) Date of Patent: Feb. 13, 2024

(54) APPARATUS AND METHODS OF PASSIVE COOLING ELECTRONIC COMPONENTS

(71) Applicants: Puneet Arora, Ottawa (CA); Edwin Iun, Ottawa (CA)

(72) Inventors: Puneet Arora, Ottawa (CA); Edwin Iun, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 192 days.

(21) Appl. No.: 17/298,854

(22) PCT Filed: Dec. 6, 2018

(86) PCT No.: PCT/IB2018/059730
§ 371 (c)(1),
(2) Date: Jun. 1, 2021

(87) PCT Pub. No.: WO2020/115532
PCT Pub. Date: Jun. 11, 2020

(65) Prior Publication Data
US 2022/0039287 A1    Feb. 3, 2022

(51) Int. Cl.
H05K 7/20    (2006.01)

(52) U.S. Cl.
CPC ..... H05K 7/20145 (2013.01); H05K 7/20127 (2013.01)

(58) Field of Classification Search
CPC ........... H05K 7/20736; H05K 7/20145; H05K 7/20163; H05K 7/20781; H05K 5/0213;
(Continued)

(56) References Cited

U.S. PATENT DOCUMENTS 5,048,598 A * 9/1991 Takemae ............ H05K 7/20272
165/104.31
5,102,617 A    4/1992 Gluntz et al.
(Continued)

FOREIGN PATENT DOCUMENTS

CN    205403040 A    7/2016
EP    2434854 A1 *    3/2012    ......... H05K 7/20572
(Continued)

OTHER PUBLICATIONS

ISR and WO for PCT/IB2018/059730.
(Continued)

*Primary Examiner* — Mandeep S Buttar
(74) *Attorney, Agent, or Firm* — Sage Patent Group

(57) ABSTRACT

An electronic component heat dissipation apparatus and methods having a heat dissipation housing. The heat dissipation housing having an external wall and an internal wall defining outer chamber therebetween. The internal wall defines an internal chamber having an airflow inlet opening and an airflow outlet opening. The housing is aligned with at least one electronic component so as to define a thermal chimney through the internal chamber for the flow of heated air. The external wall has at least one external air opening configured to allow external air into the outer chamber. The internal wall has a plurality of heat dissipation nozzles. Each heat dissipation nozzle has an external air inlet opening located within the internal wall and an external air outlet opening located within the internal chamber. The diameter of the external air inlet opening is greater than the diameter of the external air outlet opening. This allows external air to be pushed and/or pulled through the plurality of heat dissipation nozzles from the outer chamber into the internal chamber at an increasing velocity. The external air is then
(Continued)

mixed with the flow of heated air thereby increasing the speed of the flow of heated air though the internal chamber.

13 Claims, 12 Drawing Sheets

(58) Field of Classification Search
CPC ............ H05K 7/20127; H05K 7/20718; F28D 15/0233; G06F 1/20
USPC ........ 454/184, 189, 237; 361/695, 692, 690, 361/679.46, 679.49, 679.5, 691; 165/80.2, 104.33, 80.3
See application file for complete search history.

(56) References Cited

U.S. PATENT DOCUMENTS

| | | | | |
|---|---|---|---|---|
| 5,544,012 | A * | 8/1996 | Koike | ................ H05K 7/20572 165/122 |
| 5,781,411 | A | 7/1998 | Feenstra | |
| 7,443,674 | B1 * | 10/2008 | Hanlon | ............... H05K 7/20736 361/695 |
| 2005/0057899 | A1 * | 3/2005 | Lord | ....................... F28F 3/048 361/695 |
| 2009/0310301 | A1 * | 12/2009 | Nelson | ............... H05K 7/20163 361/695 |
| 2013/0233512 | A1 * | 9/2013 | Fetcu | ...................... F28F 27/02 165/104.14 |
| 2015/0216074 | A1 | 7/2015 | Nishihara et al. | |
| 2017/0162282 | A1 | 6/2017 | Lin et al. | |
| 2019/0098799 | A1 * | 3/2019 | Richards | .............. H05K 9/0015 |
| 2023/0209779 | A1 * | 6/2023 | Lancaster | .......... H05K 7/20736 454/184 |

FOREIGN PATENT DOCUMENTS

| | | |
|---|---|---|
| JP | 2003174276 A | 6/2003 |
| JP | 2008263081 A | 10/2008 |

OTHER PUBLICATIONS

EcoCooler_air_conditioner_cools_a_home_without_using_electricity_ Matthew Humphries (https://www. geek.com/author/matthew-2/) Jun. 6, 2016.

Ericsson Zero Site Description, Nov. 8, 2017.

* cited by examiner

APPARATUS AND METHODS OF PASSIVE COOLING ELECTRONIC COMPONENTS

CROSS REFERENCE TO RELATED APPLICATIONS

This application is a 35 U.S.C. § 371 national phase filing of International Application No. PCT/IB2018/059730, filed Dec. 6, 2018, the content of which is incorporated herein by reference in its entirety.

TECHNICAL FIELD

The present disclosure relates to thermal management, and in particular, to thermal management of electronic components through passive cooling.

BACKGROUND

As the world uses more and more mobile electronic products, the industry is trying to improve the scaling semiconductor process technologies and adding features to integrated circuits (IC). The miniaturization requirement to scale products to be smaller makes it difficult to control the heat dissipation from these circuits. Unmanaged excess heat could result in shorten product lifetime or in product malfunction. Heat dissipation usually requires large heat sinks or methods which are not suitable for all environments. By way of example, outdoor equipment require heat dissipation, however, cooling fans are not always a viable option due to requirements on noise and environment effect such as salt fog which can cause such cooling equipment to malfunction.

For a small cell indoor application, the active cooling using fans is difficult as the fans noise will be distracting in a typically quiet work environment. Due to this reason passive cooling is a preferred method for indoor small cell equipment that is placed above desks or work areas. An additional drawback with active cooling is the extra power required to control the fan equipment, which causes more power draw from hub equipment. Further, fan equipment emits electromagnetic radiation, and thus cost of product is increased in order to meet EMI regulatory requirements.

The scaling and miniaturization of ICs increases the gate density which in turn increases the emitted heat. The power consumption of an electronic component is divided between active power ($P_{active}$), which is the power used while the product is performing its various functions, and leakage power ($P_{leakage}$), which is the power consumed by unintended leakage that does not contribute to the IC's function.

Dynamic active power density increases with gate density and therefore causing thermal hotspots on the IC. Due to the IC process scaling and densification, the leakage power is concern on account that up to 30-50% of the total IC power consumption can be attributed to this leaked power. This is critical due to the amount of leakage current is exponentially dependent on temperature of the IC. A common rule of thumb is that leakage current doubles for every 10 C increase in temperature. In other words, this wasted power is dissipated in the form of heat and this aggregates an undesirable spiral effect.

Further, with decreasing feature sizes and dielectric thickness, there is an increasing consideration of thermal and thermal-stress that could exaggerate the over-stress and aging effects. In particular, increased temperature increases metal migration and causes wires to get thinner That also means that self-inductance of these wires will increase and compounds aging effects.

In addition to higher power consumption on IC, the resistance of a wire increases as temperature increases, which in turn means that the delay increase as temperature rises. In the realm of 5G technology, accurate timing recovery is paramount for the system to perform without degradation.

In the 5G development, the radio equipment demands more processing power with smaller footprint. These contradicting requirements increase thermal density. Development team must manage thermal profile carefully to cut power wastage and reduce system failure due to heat stress.

Some prior art devices deploy thermal management to turn on/off active functionalities to reduce the temperature and reduce the negative effects of high temperature, such as power leakage and reliability. However, this thermal management option is unavailable or impractical for many electronic components, especially for mission critical equipment. For example, automotive electronics as well as telecommunication equipment need to function under all temperatures and conditions.

Accordingly, there is a need for a satisfies these thermal management needs set out above.

SUMMARY

According to some embodiments herein, an electronic component heat dissipation apparatus for the removal of heated air created from at least one electronic component may include a heat dissipation housing having an external wall and an internal wall. An outer chamber may be defined between the two walls and an internal chamber may be defined by the internal wall. The internal chamber may have an airflow inlet opening and an airflow outlet opening to act as a thermal chimney to allow the heated air to be removed from the electronic component.

The internal wall may have a plurality of heat dissipation nozzles. Each nozzle has a passage that allows for the flow of air between the outer chamber and the internal chamber. In some embodiments, each nozzle has an external air inlet opening that may be located within the internal wall that allows for air to pass from the outer chamber into the nozzle's passage and an external air outlet opening located within the internal chamber that allows for air to pass from the passage into the internal chamber. Further, for each nozzle, the diameter of the external air inlet opening being greater than the diameter of the external air outlet opening The difference in diameter creates an increase of the velocity of the airflow as it passes through the nozzle. In some embodiments, for each of the heat dissipation nozzles, the external air outlet opening may be located downstream relative to the external air inlet opening. Additionally, the external air outlet opening may be substantially in-line with the flow of heated air.

The external wall may have at least one external air opening to allow external air into the outer chamber. The external air may be ambient atmospheric air, heated air from the electronic component or a combination thereof Further, in some embodiment, the external air opening may be located near or proximate the electronic component. Still further, the external air opening may have an external air nozzle similarly configured as a heat dissipation nozzle set out above.

In some embodiments, the external air is pushed and/or pulled through the plurality of heat dissipation nozzles from the outer chamber into the internal chamber at an increasing velocity. Once it enters into the internal chamber, it is mixed with the flow of heated air. As the flow of the external air is greater than the flow of heated air, the flow of mixed air has a greater velocity than flow of heated air. This creates a pressure difference between the two flows of air and causes the flow of heated air to increase which removes the heated air at a faster rate.

According to some embodiments here, an electronic component heat dissipation apparatus may include a heat dissipation housing having a wall defining a chamber having an airflow inlet opening and an airflow outlet opening to act as a thermal chimney to allow the heated air to be removed from the electronic component.

The wall may have a plurality of heat dissipation nozzles. Each nozzle has a passage that allows for the flow of air between ambient atmosphere and the chamber. In some embodiments, each nozzle has an ambient air inlet opening that may be located within the wall that allows for air to pass from the ambient atmosphere into the nozzle's passage and an ambient air outlet opening located within the chamber that allows for air to pass from the passage into the chamber. Further, for each nozzle, the diameter of the ambient air inlet opening is greater than the diameter of the ambient air outlet opening According to embodiment herein, an electronic component heat dissipation apparatus may include a heat dissipation housing having a wall defining a chamber. The chamber may have at least one airflow inlet opening and an airflow outlet opening to define a thermal chimney through the chamber for the flow of heated air from an electronic component.

The apparatus may also include a wind vane rotationally secured to the heat dissipation housing. The wind vane may include a venturi tube that is configured to capture airflow caused by wind. The rotational nature of the wind vane allows for air to be captured irrespective of the direction of the wind. The venturi tube may have an inlet section, a diverging diffuser section, and a throat section. The venturi tube may also have an airflow inlet. In some embodiments, the airflow inlet is located at approximately the throat section. An airflow passage between the airflow inlet and the airflow outlet opening of the chamber allows for the passage of the flow of heated air from the electronic component into the venturi tube. As the airflow of the wind moves through the venturi tube. The increased wind airflow velocity creates a pressure difference between the venturi tube and the chamber, which causes an increased velocity of the flow of heated air out of the chamber. This allows for the increase in the removal of heated air from the electronic component.

According to embodiments herein, a method of removing heat from electronic components. The method may include providing a heat dissipation housing having a wall defining internal chamber having an airflow inlet opening and an airflow outlet opening. The wall may have a plurality of heat dissipation nozzles as set out above. The housing may be arranged to align with at least one electronic component so as to define a thermal chimney through the internal chamber for the flow of heated air, such that the air heated escapes out from the at least one electronic component through the internal chamber. The method removes heat from the electronic component by having the external air being pulled through the plurality of heat dissipation nozzles into the internal chamber at an increasing velocity. The flow of external air mixes with the flow of heated air with the flow of mixed air having a velocity greater than the flow of heated air. The increasing velocity of the airflow though the internal chamber increases the velocity of the heated air escaping from the at least one electronic component to cool the at least one electronic component during use.

DETAILED DESCRIPTION

The present disclosure relates to thermal management, and in particular, to thermal management of electronic components utilizing a Venturi based technique for passive thermal management.

Some prior art devices deploy a ventilation chimney to remove heat from an electrical component. Hot air, that is air that has been heated, is less dense than cold air. As a result of this, the less dense hot air will always rise above the colder, more dense air. This is known as the principle of thermal buoyancy. More relevant is the fact that thermal buoyancy is the principle that ventilation chimneys are built around.

Figure 1:
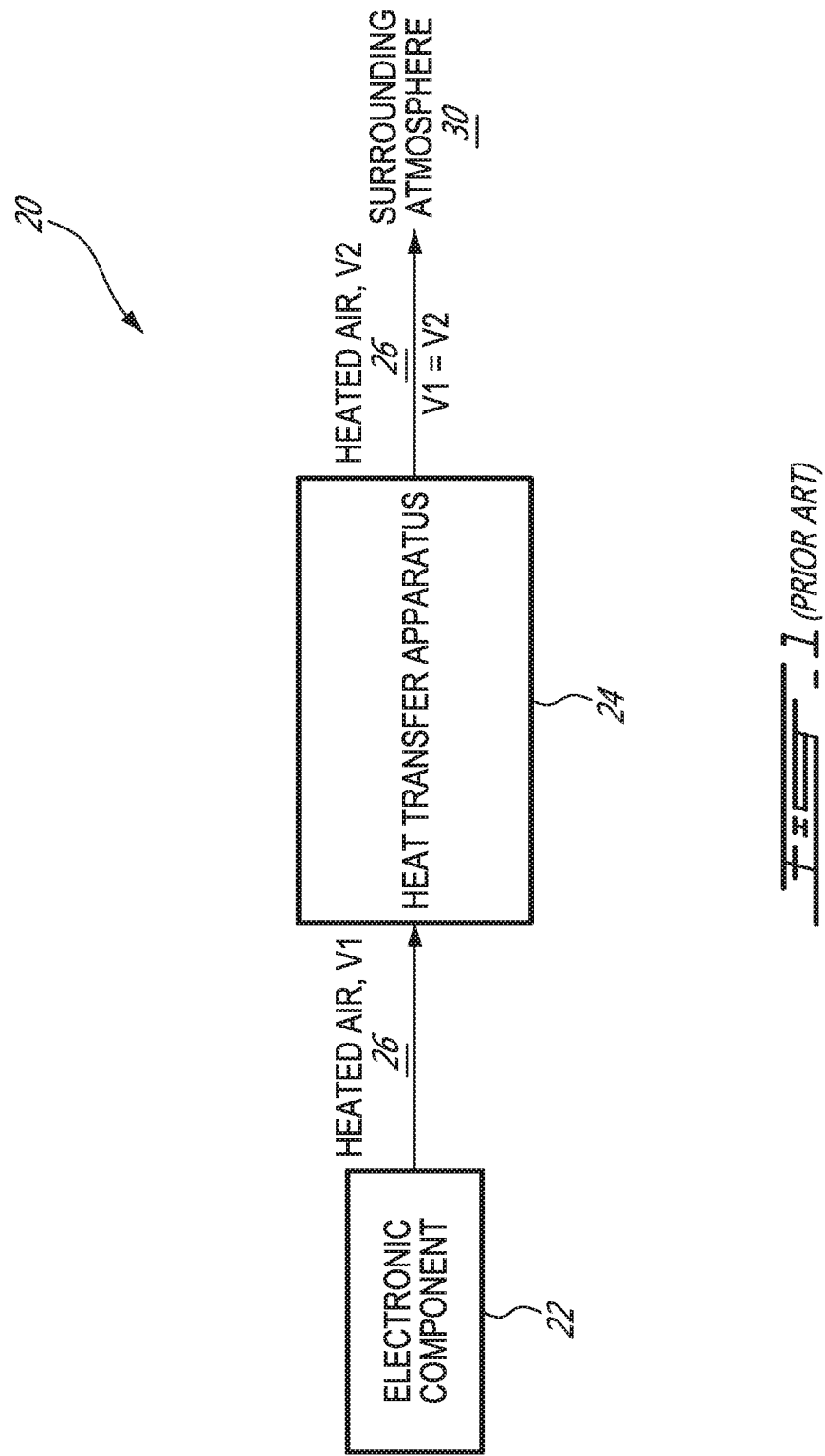
FIG. 1 is a schematic illustration of a prior art system to remove heat from an electronic component.

FIG. 1 is a schematic illustration of a prior art system 20 for the removal of heat from an electronic component 22. As previously set out, when an electronic component 22 is in operation it creates heated air 26 that surrounds the electronic component 22. In order to cool down electronic component 22, heated air 26 is removed from the area surrounding electronic component 22 by a heat transfer apparatus 24. Heat transfer apparatus 24 may be a typical ventilation chimney having the same size openings for heated air 26 to enter and exit. In operation, heated air 26 rises into the heat transfer apparatus 24 at a velocity, V1, from electronic component 22 based on the thermal buoyancy principle. Heated air 26 passes through heat transfer apparatus 24 and exits into the atmosphere 30 at a distance away from the electronic component 22. Due to heat transfer apparatus 24 having substantially equal sized opening for the entrance and exit of heated air 26, when heated air 26 exits the heat transfer apparatus 24, it exits with an exit velocity V2, which is substantially equal to entry velocity V1.

Figure 2:
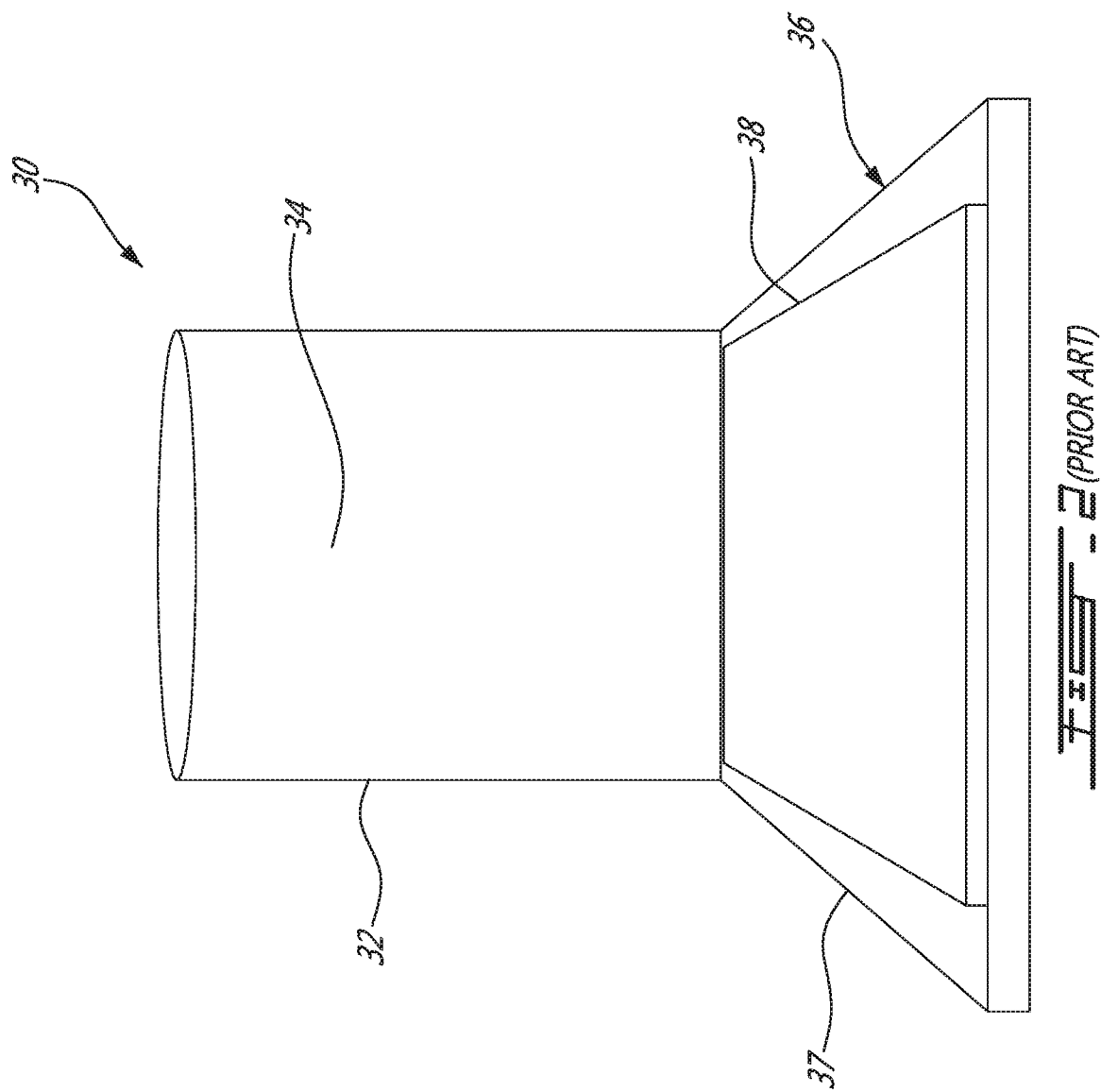
FIG. 2 is a perspective view of a prior art ventilation chimney.

As illustrated in FIG. 2, an application of a prior art chimney is disclosed. The prior art chimney 30 traditionally is located above an electronic component, such as a printed circuit board (PCB) 36. A heat sink 38 sits on top of the PCB 36 in order to draw heat from the PCB 36 which in turn heats the surrounding air. An outer cover 37 provides the mechanical support of the assembly. The prior art chimney 30 typically is a single walled pipe 32 that creates a cavity 34 which acts like a chimney for the removal of the heated air from around PCB 36.

While traditional ventilation chimneys allow for air convection, in non-climate controlled environment, this air flow can be inadequate especially in extreme condition. When an electronic component chimney is enclosed and does not have sufficient free air flow, the heat from the component is not dissipated as a sufficient rate causing the component to heat up where it could exceed its maximum operational temperature.

In general, the present invention applies a Venturi based technique for passive thermal management. The present invention is directed toward the dissipation the rising equipment heat as fast as possible while not employing noisy active device such as a fan. The present invention, utilizing a Venturi-based technique, harvests natural wind movement in the area surrounding the electronic component in combination with the rising heating air from the electronic component in order to increase the speed of the rising heating air to dissipate heat away from the electronic component at faster rate.

Figure 3:
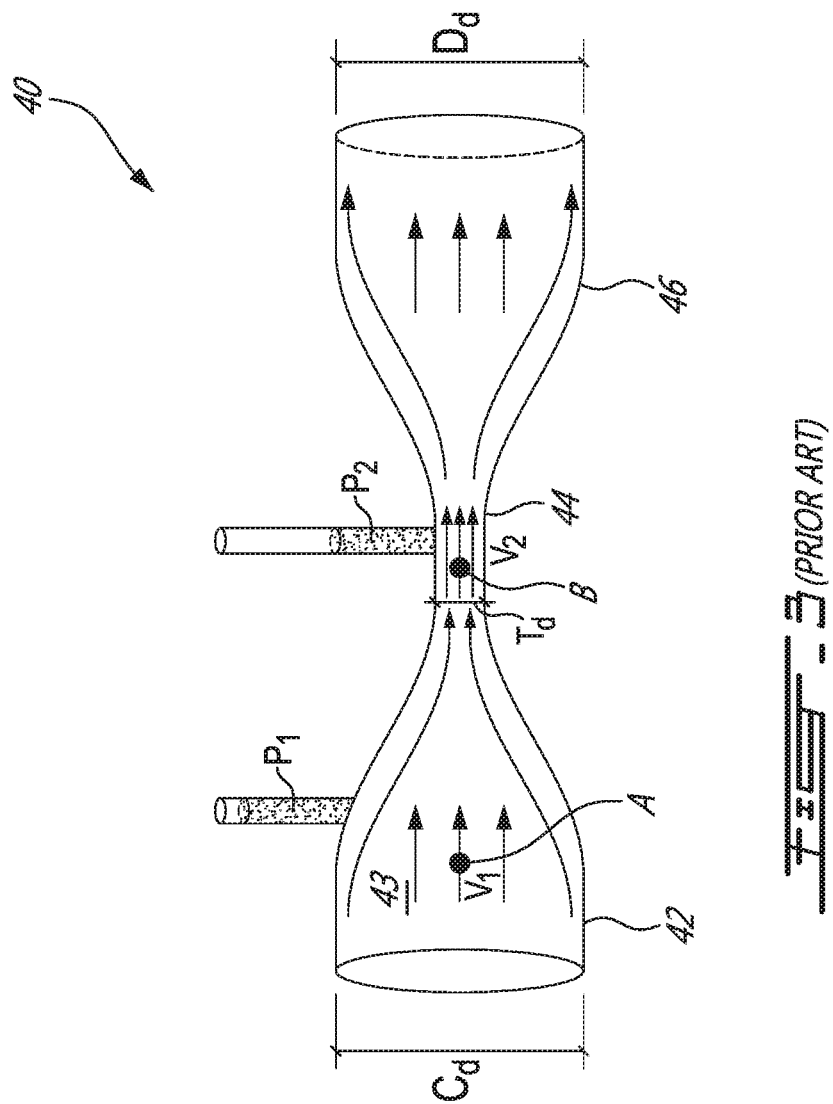
FIG. 3 is a general illustration of a Venturi pipe.

The Venturi effect is the reduction in fluid pressure that results when a fluid flows through a constricted section of a pipe. As generally illustrated in FIG. 3, a venturi pipe 40 includes a conversion part 42, a throat 44 and a dispersion part 46, where the diameter $C_d$ of the conversion part 42 is greater than diameter $T_d$ of the throat 44. At point A in conversion part 42, the airflow 43 has a velocity of $V_1$ and has a static pressure of $P_1$. At point B, in throat 44, the airflow has a velocity of $V_2$ and has a static pressure of $P_2$.

The static pressure $P_1$ in the conversion part 42, at point A, is higher than the static pressure $P_2$ in the throat 44, at point B, while the fluid velocity $V_1$ at point A is lower than the velocity $V_2$ at point B. This is due to the cross-sectional area at point A is greater than at point B. This results in an increased airflow at point B.

Figure 4:
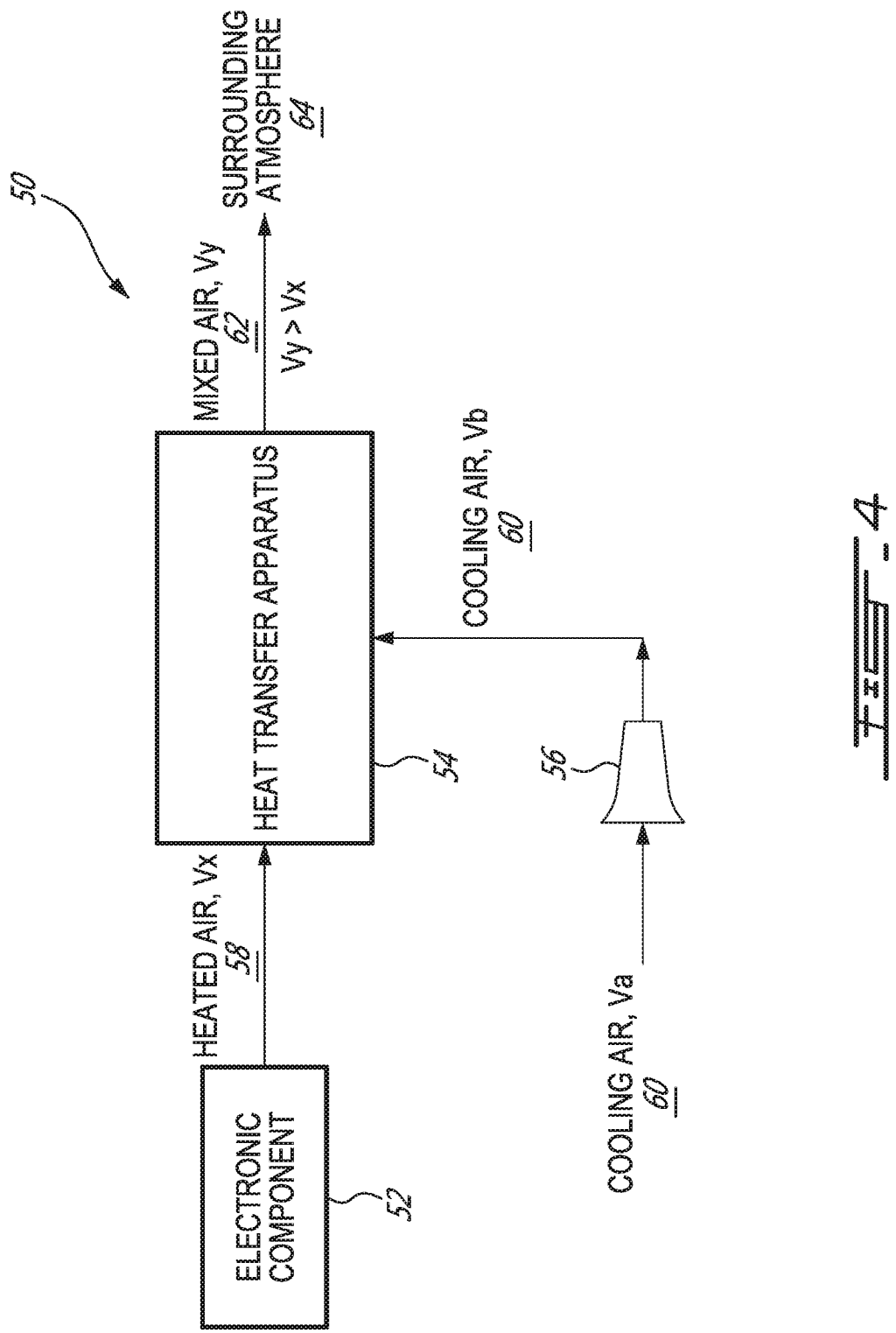
FIG. 4 is a schematic illustration of an embodiment of a system to remove heat from an electronic component of the present invention.

FIG. 4 is a schematic illustration of an embodiment of a system 50 for the removal of heat from an electronic component 52 of the present invention. In this embodiment, electronic component 52 creates heated air 58 that surrounds the electronic component 52. Heated air 58 rises into the heat transfer apparatus 54 at an entry velocity, Vx, from electronic component 52 based on the thermal buoyancy principle.

Natural cooling air 60 also enters heat transfer apparatus 54 through one or more venturi-based nozzles 56. Natural cooling air 60 may be any air from the area surrounding the electronic component 52. Cooling air 60 may pass through the one or more nozzles 56 by being pushed by natural external forces, such as wind, pulled by the pressure differential caused by the movement of the heated air 58 through heat transfer apparatus 54 or a push/pull combination.

Cooling air 60 has a nozzle entry velocity Va and a nozzle exit velocity Vb which is greater than Va. The increase of airflow velocity is due to each of the one of nozzles being configured to have a decreasing diameter from its entry to its exit. The nozzle exit velocity Vb is also greater than the heated air 58 entry velocity Vx.

As heated air 58 passes through heat transfer apparatus 54, it mixes with cooling air 60 and exits into the atmosphere 64 at a distance away from the electronic component 52. Due to cooling air 60 having an airflow velocity Vb that is greater than the entry velocity Vx of heated air 58, the velocity Vy of the mixed airflow 62 is greater than the airflow velocity Vx of heated air 58. The increased velocity of mixed airflow 62 allows for an increased amount of heat to be removed from electronic component 52, thus cooling electronic component 52 faster.

Additionally, system 50 creates a self-regulated heat dissipation rate. The flow of cooling air 60 through nozzle 56 is based in part on the pressure difference induced by a temperature difference between cooling air 60 and heated air 58. When the temperatures are at an equilibrium, the flow of cooling air 60 will stop. This is a superior solution to fan-based active cooling solutions as there is no excess energy used for cooling when such cooling is not necessary.

Figure 5:
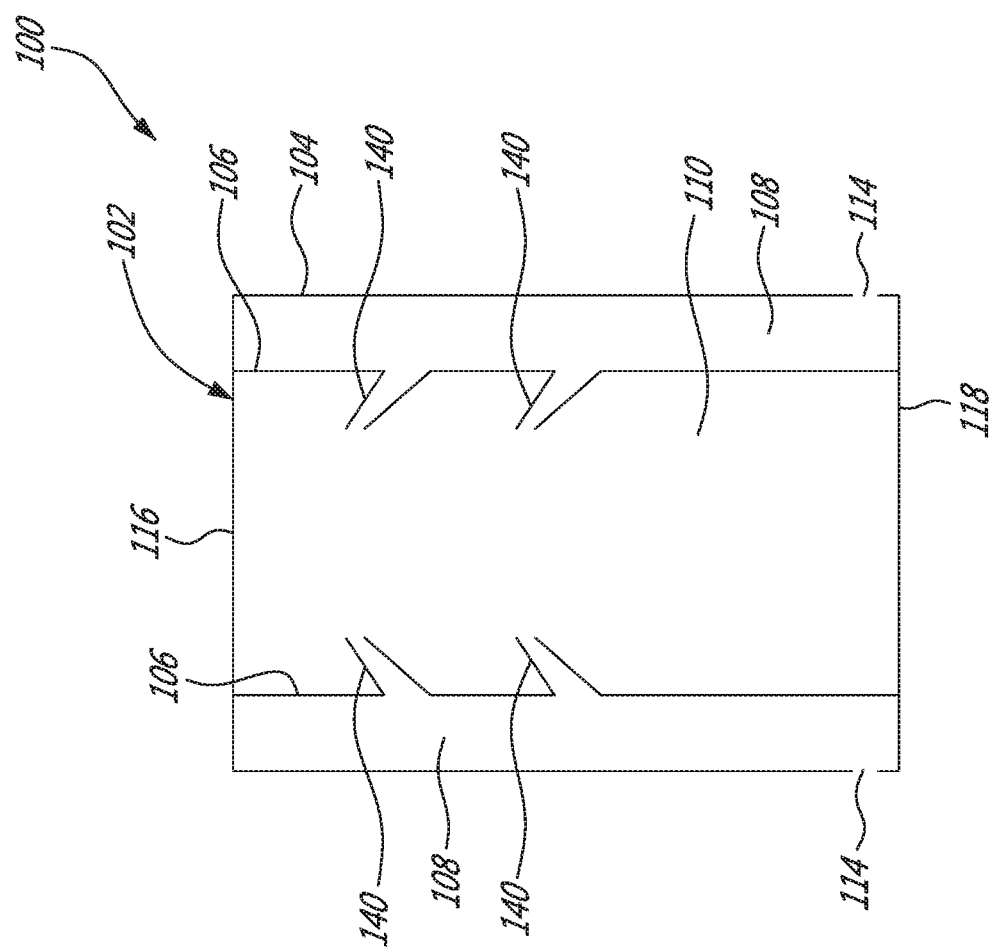
FIG. 5 is a cut-away perspective view of an embodiment of the present invention.
Figure 6:
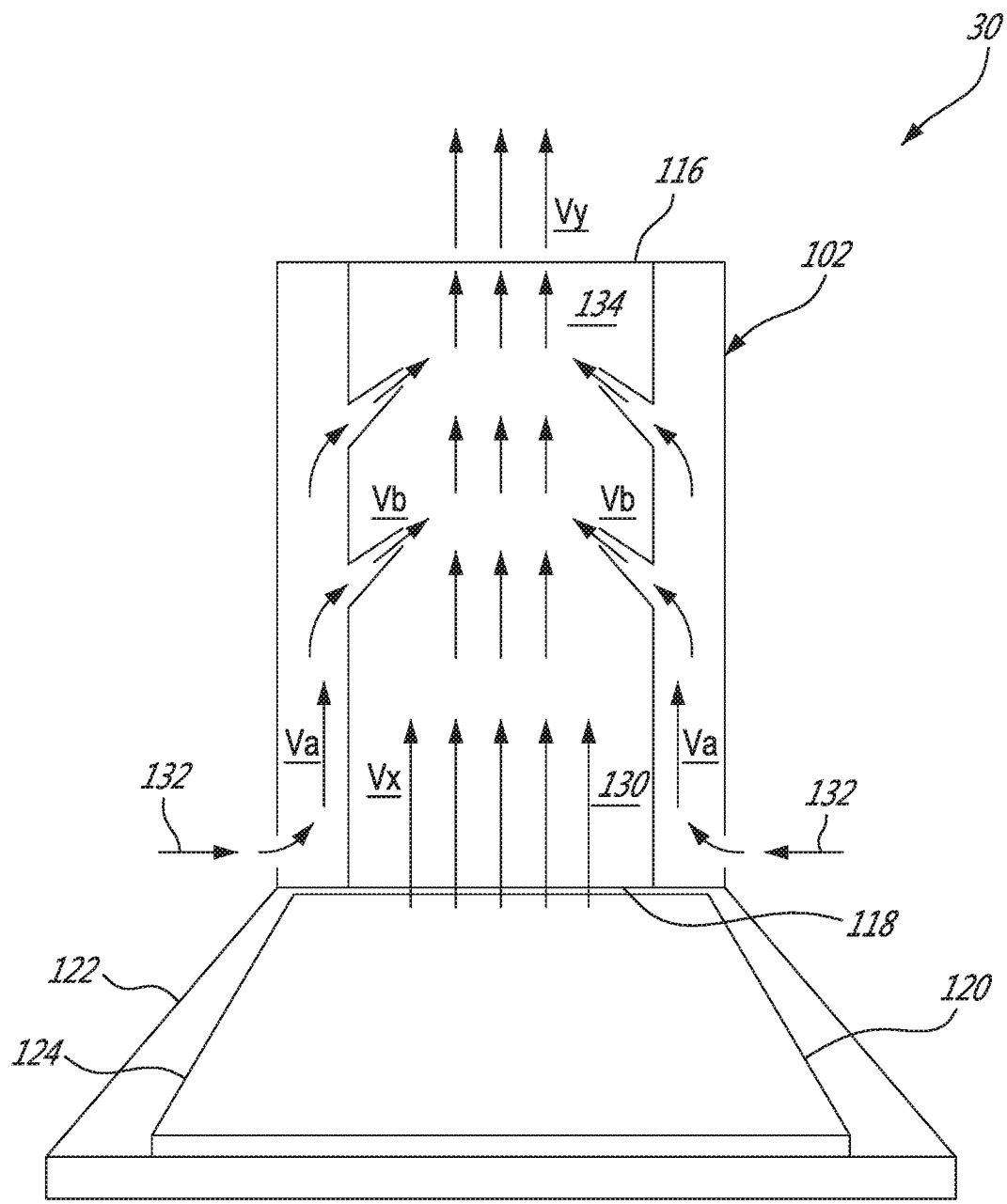
FIG. 6 is a perspective view of an embodiment of the present invention illustrating airflow through and around the embodiment.

As illustrated in FIGS. 5 and 6, an embodiment of an electronic component heat dissipation apparatus 100 of the present invention is disclosed. Apparatus 100 includes a heat dissipation housing 102 having an external wall 104 and an internal wall 106 defining an outer chamber 108 therebetween. Internal wall 106 defines an internal chamber 110 having an airflow inlet opening 118 and an airflow outlet opening 116.

Housing 102 is aligned with printed circuit board (PCB) 120 having a heat sink 124 sitting on top of the PCB 120, while outer cover 122 provides mechanical support of the assembly. Heated air 130 rises at an entry velocity Vx from PCB 120 via heat sink 124 through airflow inlet opening 118 into internal chamber 110 which acts as a thermal chimney for the flow of heated air 130 being emitted from PCB 120.

External wall 104 has at least one external air opening 114 which allow external air 132 into the outer chamber 108. In some embodiments, external air 132 may be cooler ambient air from the area surrounding apparatus 100.

Figure 7:
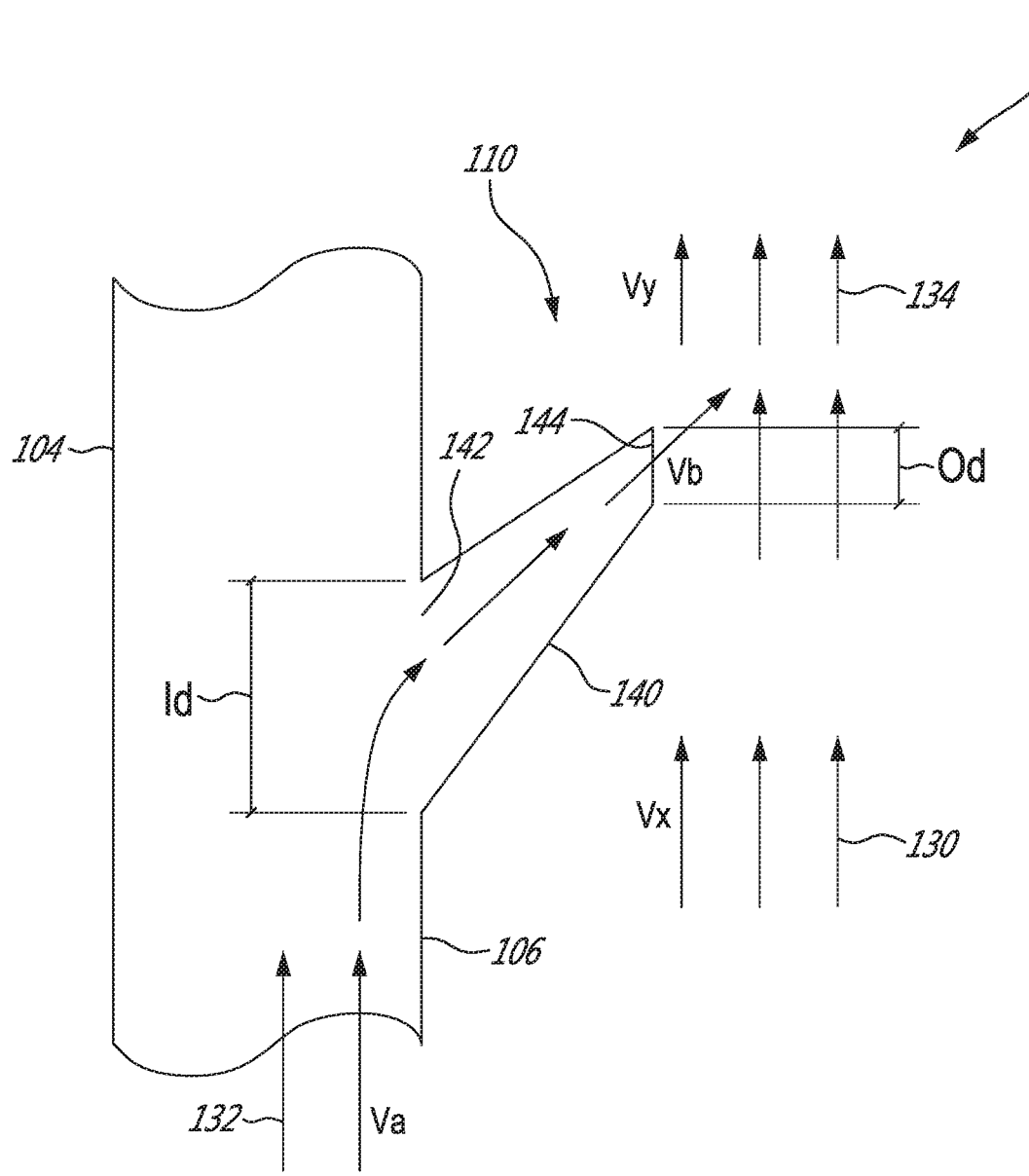
FIG. 7 is a close-up perspective view of an embodiment of a heat dissipation nozzle of the present invention.

Internal wall 106 has a plurality of heat dissipation nozzles 140. As illustrated in FIG. 7, each heat dissipation nozzle 140 has an external air inlet opening 142 located within the internal wall 106 and an external air outlet opening 144 located within the internal chamber 110. Each of the nozzles 140 are configured to have a decreasing diameter from its entry to its exit. As such, the diameter $I_d$ of the external air inlet opening is greater than the diameter $O_d$ of the external air outlet opening. Further, each nozzle 140 may be generally aligned with the flow of heated air 130 such that any airflow out of nozzle 140 through external air outlet opening 144 may be substantially in-line with the flow of heated air 130. In this embodiment, the external air inlet opening 142 is shown to be within internal wall 106. This is illustrative and not meant to be limiting. The external air inlet opening may extend beyond internal wall 106 and into the outer chamber 108.

As the air around PCB is heated, it will rise as heated air 130 into internal chamber 110. The rising heated air 130 creates a pressure difference, sometimes referred to as draft. This pressure difference will force the heated air 130 through the internal chamber 110 and out into the surround atmosphere via the external air outlet opening 116.

External air 132 may be pulled through the plurality of heat dissipation nozzles 140 from the outer chamber 108 into the internal chamber 110 at a velocity Vb which is greater than the airflow velocity Vx of heated air 130, and mixed with the airflow of heated air 130. The resulting velocity Vy of mixed airflow 134 is greater than the heated air 130 velocity Vx, thereby increasing the velocity of the mixed airflow 134 though the internal chamber 110. This causes the heat around to PCB 120 to be removed faster and allows PCB 120 to cool at a faster rate.

Figure 8:
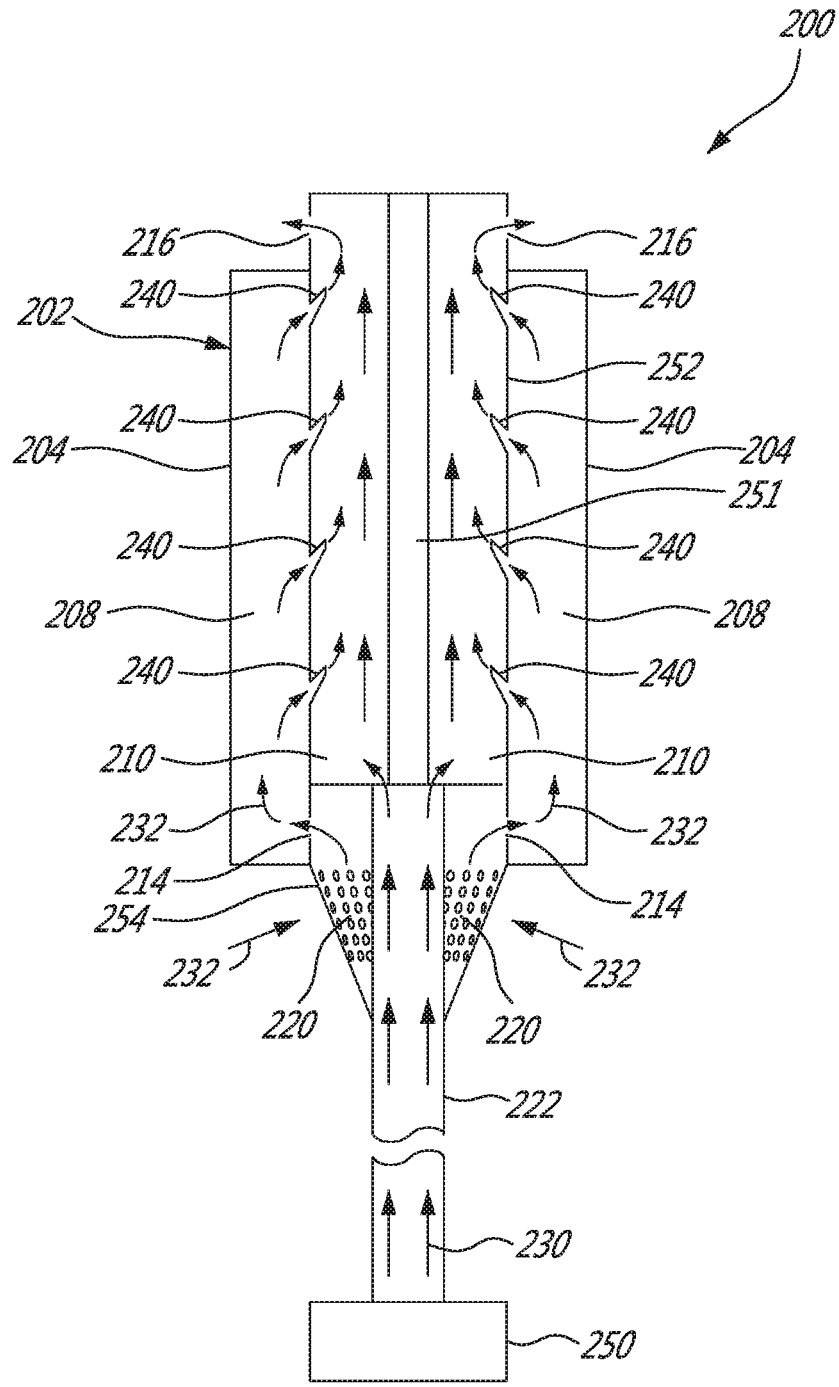
FIG. 8 is a cross-sectional view of an additional embodiment of the present invention.

As illustrated in FIG. 8, an additional embodiment of an electronic component heat dissipation apparatus 200 of the present invention is disclosed. In this embodiment, apparatus 200 is applied to a telecommunication product including radio equipment used to provide cellular network signals. The telecommunication product includes a Radome 252 having an interior space 251. The Radome 252 sits atop a main pole 222 and a cone 254. Radio equipment may be located within interior space 251, may be located in a compartment 250 below Radome 252 or a combination of both. The hot air 230 is generated by the radio equipment. The Radome 252 is designed with exhaust air outlet holes 216 at its top. Cone 254 includes a plurality of air inlet holes 220 to allow external air 232 therein.

The heat dissipation apparatus 200 includes a heat dissipation housing 202 surrounding the Radome 252. Housing 202 has an external wall 204 where an outer chamber 208 is defined between external wall 204 and Radome 252 therebetween. The wall of Radome 252 defines an internal chamber 210.

External wall 204 has at least one external air opening 214 which allow external air 232 into the outer chamber 108. In some embodiments, external air 232 may be cooler ambient air from the area surrounding apparatus 200. In some embodiment, external air openings 214 may include one or more nozzles 240 which are similarly designed as the Venturi-bases nozzles above.

The wall of Radome 252 has a plurality of heat dissipation nozzles 240 which allow for external air 232 to pass into the Radome 252 at a velocity greater than the velocity of hot air 230. This causes the air within the Radome 252 to be vented at a greater velocity and thus cools the interior radio equipment faster.

Figure 9:
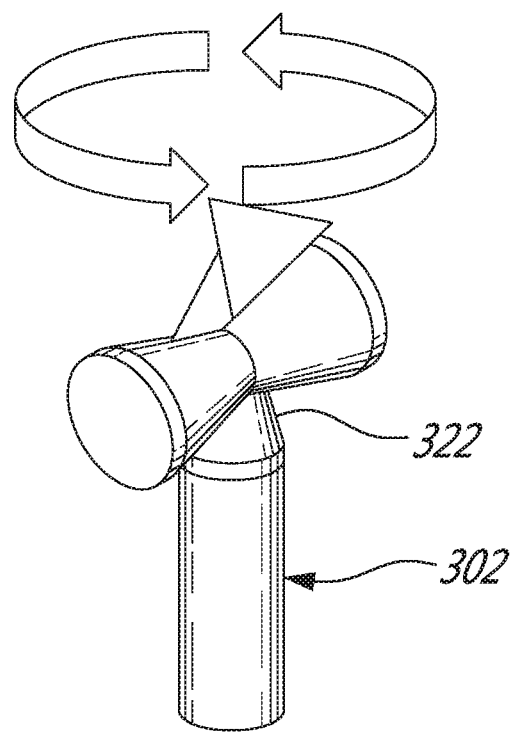
FIG. 9 is a perspective view of an additional embodiment of the present invention.
Figure 10:
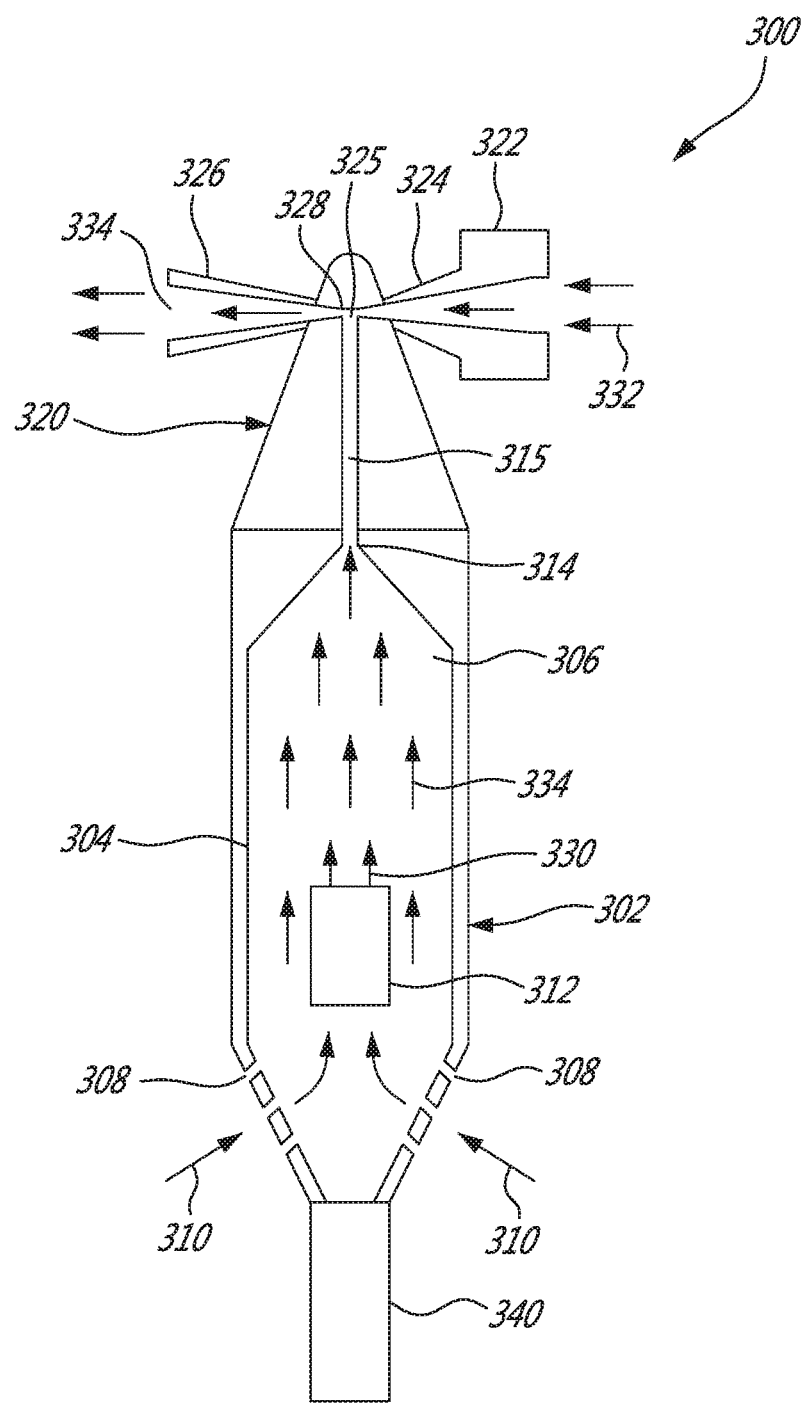
FIG. 10 is a cross-sectional view of the embodiment of the present invention as shown in FIG. 9.

As illustrated in FIGS. 9 and 10, an additional embodiment of an electronic component heat dissipation apparatus 300 of the present invention is disclosed. In this embodiment, apparatus 300 is applied to a telecommunication product 312 used to provide cellular network signals.

The heat dissipation apparatus 300 includes a heat dissipation housing 302 surrounding the telecommunication product 312. Housing 302 may sit on a main pole 340. Housing 302 has an external wall 304 that defines an internal chamber 306. The telecommunication product 312 is located within internal chamber 306. Housing 302 has at least one airflow inlet opening 308 and an airflow outlet opening 314. Inlet opening 308 is configured to allow external airflow 310 to enter into internal chamber 306. External airflow 310 mixes with heated air 330 that is created by telecommunications produce 312. The mixed airflow 334 exits the internal chamber 306 through outlet opening 314.

Apparatus 300 further includes a wind vane 320 rotationally secured to the heat dissipation housing 302. Wind vane 320 includes a venturi tube 322 and an airflow passage 315. Venturi tube 322 has an inlet section 324, a diverging diffuser section 326, and a throat section 328 having an airflow inlet 325. Airflow passage 315 is in communication with the venturi tube airflow inlet 325 and with heat dissipation housing airflow outlet opening 314 to allow passage of the flow of mixed air 334 from the heat dissipation housing 302 through the venturi tube 322.

The wind vane 320 allows for the rotation of the venturi tube 322 in order to capture external air 332 due to wind. The flow of air 332 will increase in velocity as is passes through venturi tube 322. The increased velocity of the flow of air 332 will cause a pressure difference with the flow of mixed air 334. This pressure difference will cause the flow of mixed air 334 to increase in velocity. As such, the heated air around telecommunications product 312 will be removed at a faster rate, and thus will cool down at a faster rate.

Figure 11:
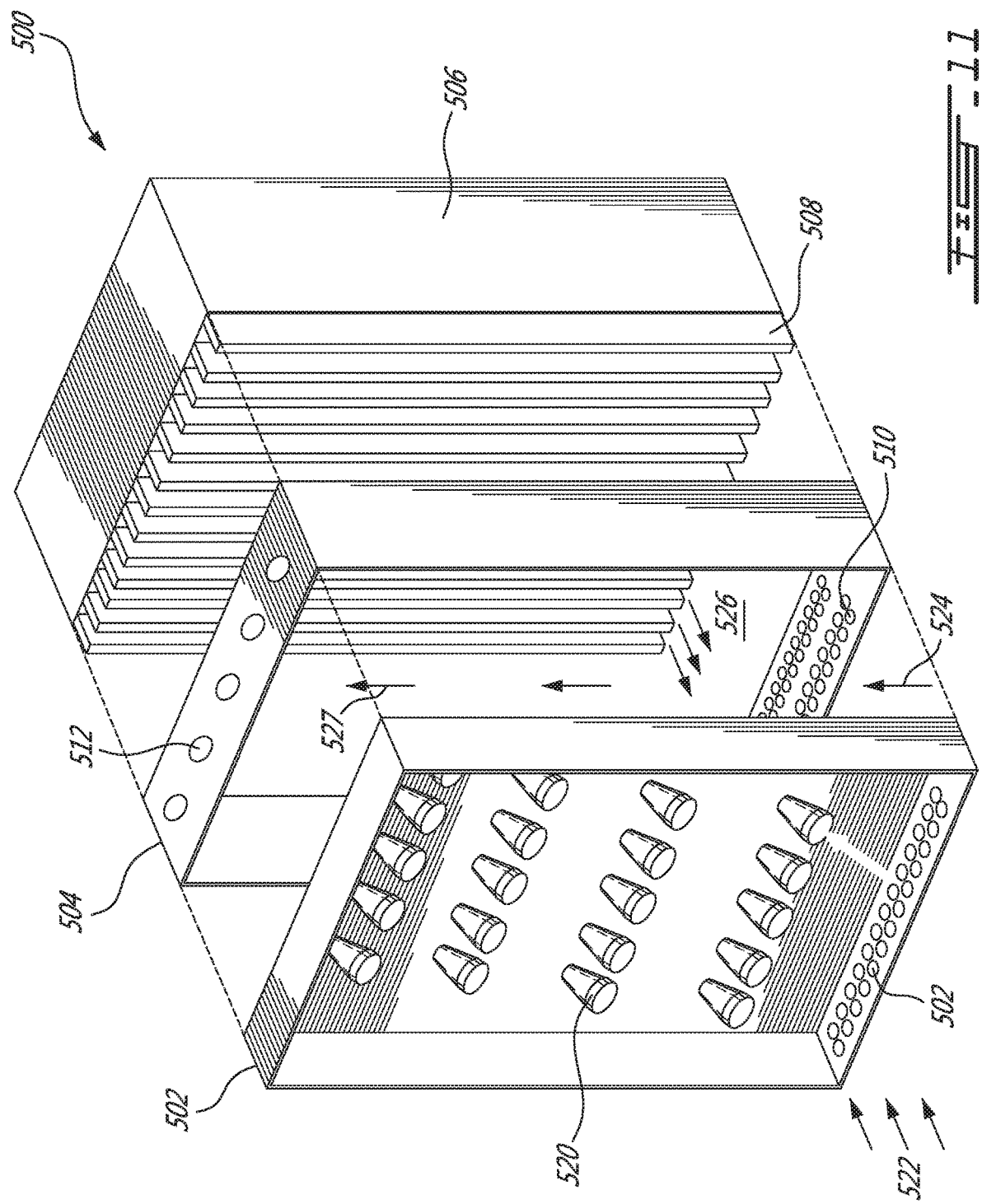
FIG. 11 is a perspective view of an additional embodiment of the present invention.

As illustrated in FIG. 11, an additional embodiment of an electronic component heat dissipation apparatus 500 of the present invention is disclosed. In this embodiment, apparatus 500 is applied to a telecommunication product 506 that utilizes a solar shield 502 to block the effects of the sun on the telecommunication product 506. In this embodiment, telecommunication product 506 includes a heat sink 508.

Solar shield 502 is attached to telecommunication product 506 by a mounting bracket 504 proximate to heat sink 508. Mounting bracket 504 includes a series of cool air inlets 510 and hot air outlets 512. Cooling air 524 enters into the space created between solar shield 502 and telecommunication product 506 and mixes with hot air 526 being created by heat sink 508. The mixed air 527 is removed through hot air outlets 512.

Solar shield 502 includes a plurality of heat dissipation nozzles 520 which are similarly designed as the Venturi-bases nozzles above. Nozzles 520 allow for external air 522 to pass into the space created between solar shield 502 and telecommunication product 506 at a velocity greater than the velocity of hot air 526. This causes the mixed air 527 to be vented at a greater velocity and thus cooling the telecommunication product 506 as at faster rate.

Figure 12:
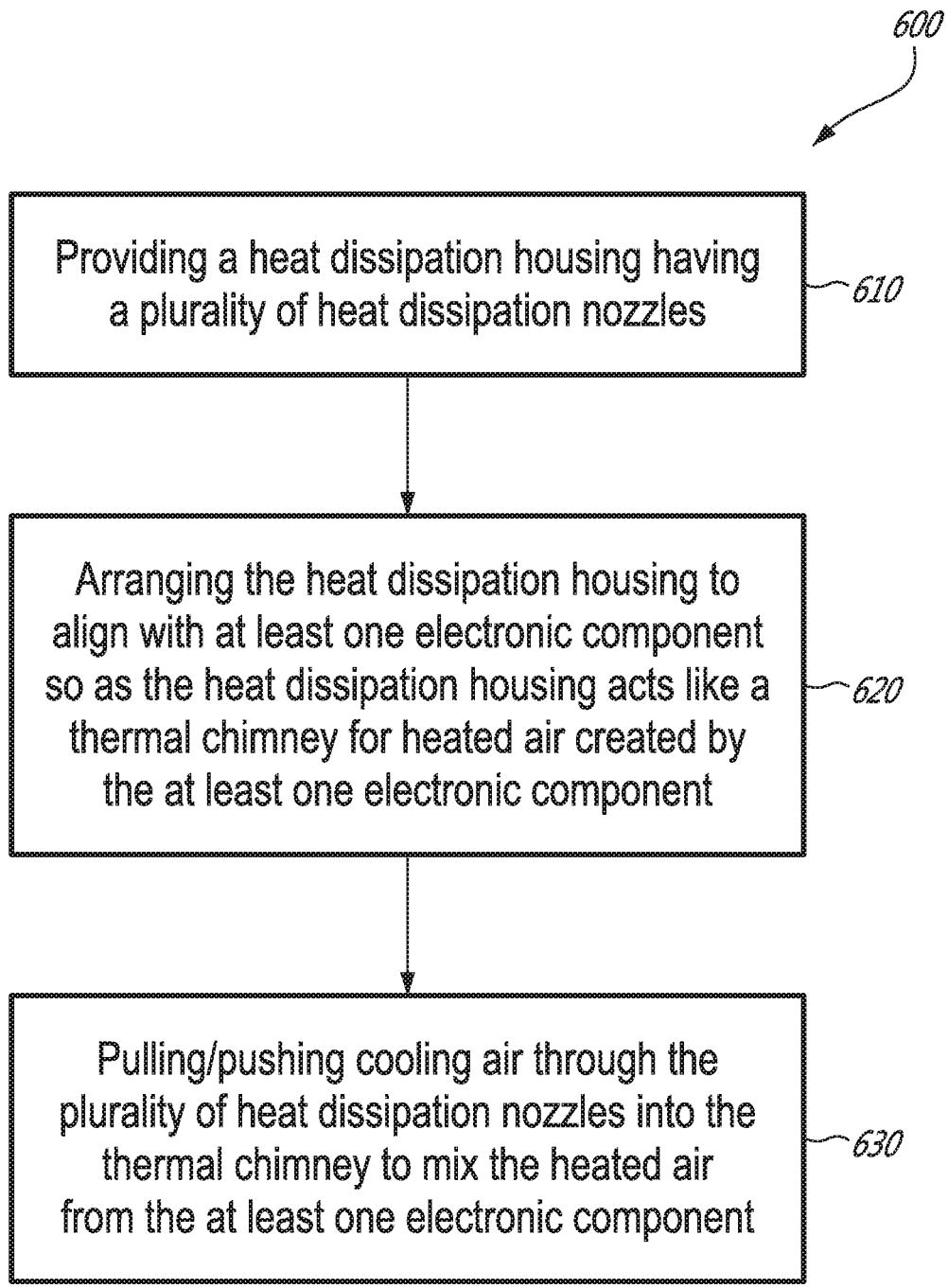
FIG. 12 is a flow chart describing a method of removing heat from the electronic component.

As illustrated in FIG. 12, an embodiment of a method of removing heat from electronic components 600 is disclosed. The method includes providing 610 a heat dissipation housing 102. The heat dissipation housing 102 has a wall 106 defining internal chamber 110 having an airflow inlet opening 118 and an airflow outlet opening 116. The wall 106 has a plurality of heat dissipation nozzles 140. Each heat dissipation nozzle 104 has an air inlet opening 142 located within the wall 106 and an air outlet opening 144 located within the internal chamber 110. The diameter Id of the air inlet opening 142 is greater than the diameter Od of the air outlet opening 144.

The method 600 further arranges 620 the heat dissipation housing 102 to align with at least one electronic component 120 so as to define a thermal chimney through the internal chamber 110 for the flow of air 130. This allows the air heated 130 by the at least one electronic component 120 to escape out from the at least one electronic component 120 through the internal chamber 110.

Air 132 is pulled and/or pushed 630 through the plurality of heat dissipation nozzles 140 into the internal chamber 110 at an increasing velocity. The increased velocity of the airflow though the internal chamber 110 increases the velocity of the heated air 130 escaping from the at least one electronic component 120 to cool the at least one electronic component 120 during use.

Method 600 is described for use with housing 102. However, this is illustrative and not meant to be limiting. Other configurations of the housing may be used and be within the scope of the present invention.

The invention claimed is:

1. An electronic component heat dissipation apparatus comprising:
   a heat dissipation housing having an external wall and an internal wall defining outer chamber therebetween, the internal wall defining internal chamber having an airflow inlet opening and an airflow outlet opening,
   the heat dissipation housing being aligned with at least one electronic component so as to define a thermal chimney through the internal chamber for the flow of heated air,
   the external wall having at least one external air opening configured to allow external air into the outer chamber, the internal wall having a plurality of heat dissipation nozzles, each heat dissipation nozzle having an external air inlet opening having an inlet diameter (Id) located within the internal wall and an external air outlet opening having an outlet diameter (Od) located within the internal chamber, the inlet diameter being greater than the outlet diameter, whereby external air is pushed and/or pulled through the plurality of heat dissipation nozzles from the outer chamber into the internal chamber at an increasing velocity from the outer chamber into the internal chamber and mixing with the flow of heated air thereby increasing the velocity of the flow of heated air though the internal chamber.

2. The electronic component heat dissipation apparatus of claim 1, wherein for each heat dissipation nozzle, the external air outlet opening is located downstream relative to the external air inlet opening.

3. The electronic component heat dissipation apparatus of claim 1, wherein for each heat dissipation nozzle, the external air outlet opening is substantially in-line with the flow of heated air.

4. The electronic component heat dissipation apparatus of claim 2, wherein the at least one external air opening is located proximate the at least one electronic component.

5. The electronic component heat dissipation apparatus of claim 4, wherein the at least one external air opening being configured to allow ambient air into the outer chamber.

6. The electronic component heat dissipation apparatus of claim 1, wherein the external wall further comprises at least one heated air opening configured to allow heated air from the at least one electronic component into the outer chamber.

7. The electronic component heat dissipation apparatus of claim 6, wherein the at least one external air opening is further defined as comprising:
a heated air inlet opening and a heated air outlet opening located within the outer chamber, the diameter of the heated air inlet opening being greater than the diameter of the heated air outlet opening.

8. An electronic component heat dissipation apparatus comprising:
a heat dissipation housing having a wall defining a chamber having an airflow inlet opening and an airflow outlet opening,
the heat dissipation housing being aligned with at least one electronic component so as to define a thermal chimney through the chamber for the flow of heated air,
the wall having a plurality of heat dissipation nozzles, each heat dissipation nozzle having an air inlet opening located within the internal wall and an air outlet opening located within the chamber, the diameter of the air inlet opening being greater than the diameter of the air outlet opening,
whereby air is pushed and/or pulled through the plurality of heat dissipation nozzles into the chamber at an increasing velocity and mixing with the flow of heated air thereby increasing the velocity of the flow of heated air though the chamber.

9. An electronic component heat dissipation apparatus comprising:
a heat dissipation housing being aligned with at least one electronic component so as to define a thermal chimney for the flow of heated air, the housing having a wall having a plurality of heat dissipation nozzles, each heat dissipation nozzle having an air inlet opening located within the wall and an air outlet opening located within the thermal chimney, the diameter of the air inlet opening being greater than the diameter of the air outlet opening,
whereby air is pulled through the plurality of heat dissipation nozzles into the thermal chimney at an increasing velocity and mixing with the flow of heated air thereby increasing the velocity of the flow of heated air though the thermal chimney.

10. An electronic component heat dissipation apparatus comprising:
a heat dissipation housing having a wall defining a chamber having at least one airflow inlet opening and an airflow outlet opening, the housing being aligned with at least one electronic component so as to define a thermal chimney through the chamber for the flow of heated air, the wall having a plurality of heat dissipation nozzles, each heat dissipation nozzle having an air inlet opening having an inlet diameter (Id) located within the wall and an air outlet opening having an outlet diameter (Od) located within the chamber, the inlet diameter being greater than the outlet diameter; and
a wind vane rotationally secured to the heat dissipation housing, the wind vane having a venturi tube and an airflow passage, the venturi tube having inlet section, a diverging diffuser section, and a throat section having an airflow inlet, the airflow passage being in direct communication with the venturi tube airflow inlet and heat dissipation housing airflow outlet to allow passage of the flow of heated air from the heat dissipation housing through the venturi tube.

11. A method of removing heat from electronic components, comprising the steps of:
providing a heat dissipation housing having a wall defining internal chamber having an airflow inlet opening and an airflow outlet opening, the wall having a plurality of heat dissipation nozzles, each heat dissipation nozzle having an air inlet opening having an inlet diameter (Id) located within the wall and an air outlet opening having an outlet diameter (Od) located within the internal chamber, the inlet diameter being greater than the outlet diameter; and
arranging the heat dissipation housing to align with at least one electronic component so as to define a thermal chimney through the internal chamber for the flow of air,
whereby air heated by the at least one electronic component escapes out from the at least one electronic component through the internal chamber,
whereby air is pulled through the plurality of heat dissipation nozzles into the internal chamber at an increasing velocity thereby increasing the velocity of the airflow though the internal chamber, thereby increasing the velocity of the heated air escaping from the at least one electronic component to cool the at least one electronic component during use.

12. The method of removing heat from electronic components of claim 11, wherein the internal chamber is a generally vertical passage relative to the at least one electronic component.

13. A method of removing heat from electronic components, comprising the steps of:
providing a heat dissipation housing having an external wall and an internal wall defining outer chamber therebetween, the internal wall defining internal chamber having an airflow inlet opening and an airflow outlet opening, the external wall having at least one air opening configured to allow air into the outer chamber, the internal wall having a plurality of heat dissipation nozzles, each heat dissipation nozzle having an air inlet opening having an inlet diameter (Id) located within the internal wall and an air outlet opening having an outlet diameter (Od) located within the internal chamber, the inlet diameter being greater than the outlet diameter;

arranging the heat dissipation housing to align with at least one electronic component so as to define a thermal chimney through the internal chamber for the flow of air, whereby air heated by the at least one electronic component escapes out from the at least one electronic component through the internal chamber, whereby air is pulled through the plurality of heat dissipation nozzles into the internal chamber at an increasing velocity thereby increasing the speed of the airflow though the internal chamber, thereby increasing the velocity of the heated air escaping from the at least one electronic component to cool the at least one electronic component during use.

* * * * *